(12) United States Patent
Shen et al.

(10) Patent No.: US 10,135,571 B2
(45) Date of Patent: Nov. 20, 2018

(54) POLAR CODE PROCESSING METHOD AND SYSTEM, AND WIRELESS COMMUNICATIONS APPARATUS

(71) Applicant: Huawei Technologies Co., Ltd., Shenzhen, Guangdong (CN)

(72) Inventors: Hui Shen, Shenzhen (CN); Bin Li, Shenzhen (CN); Jun Chen, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 140 days.

(21) Appl. No.: 15/196,708

(22) Filed: Jun. 29, 2016

(65) Prior Publication Data
US 2016/0308644 A1    Oct. 20, 2016

Related U.S. Application Data (63) Continuation of application No. PCT/CN2013/090997, filed on Dec. 31, 2013.

(51) Int. Cl.
*H04L 1/00* (2006.01)
*H03M 13/13* (2006.01)
(Continued)

(52) U.S. Cl.
CPC .......... *H04L 1/0068* (2013.01); *H03M 13/13* (2013.01); *H03M 13/2792* (2013.01);
(Continued)

(58) Field of Classification Search
CPC ... H04L 1/0041; H04L 1/0057; H04L 1/0068; H04L 1/0069; H04L 1/1819;
(Continued)

(56) References Cited

U.S. PATENT DOCUMENTS

| | | | |
|---|---|---|---|
| 8,595,585 B2 * | 11/2013 | Djordjevic | ......... H03M 13/1117 714/755 |
| 8,768,175 B2 * | 7/2014 | Djordjevic | ........... H04B 10/548 398/152 |

(Continued)

FOREIGN PATENT DOCUMENTS

| | | |
|---|---|---|
| CN | 1494332 A | 5/2004 |
| CN | 101630989 A | 1/2010 |

(Continued)

OTHER PUBLICATIONS

K. Niu and K. Chen, "Hybrid coding scheme based on repeat-accumulate and polar codes," in Electronics Letters, vol. 48, No. 20, pp. 1273-1274, Sep. 27, 2012.*
R. Wang and R. Liu, "A Novel Puncturing Scheme for Polar Codes," in IEEE Communications Letters, vol. 18, No. 12, pp. 2081-2084, Dec. 2014.*

(Continued)

*Primary Examiner* — Cynthia Britt (57) ABSTRACT

A polar code processing method and system, and a wireless communications apparatus are provided, where the method includes: acquiring at least two periodic puncturing patterns and combining the at least two periodic puncturing patterns in a predetermined manner to obtain at least two hybrid puncturing patterns; selecting, from the at least two hybrid puncturing patterns, one with a lowest frame error rate as an optimal puncturing pattern; and performing rate matching on polar polar-coded bits according to the optimal puncturing pattern, and using the rate-matched bits as to-be-transmitted bits. A frame error rate may be reduced and HARQ performance of a polar code may be enhanced.

10 Claims, 7 Drawing Sheets

(51) Int. Cl.
*H03M 13/27* (2006.01)
*H03M 13/29* (2006.01)
*H03M 13/00* (2006.01)
*H04L 1/18* (2006.01)

(52) U.S. Cl.
CPC ... *H03M 13/2906* (2013.01); *H03M 13/6306* (2013.01); *H03M 13/6362* (2013.01); *H04L 1/0057* (2013.01); *H04L 1/0069* (2013.01); *H04L 1/1819* (2013.01); *H04L 1/0041* (2013.01)

(58) Field of Classification Search
CPC ............. H03M 13/13; H03M 13/2792; H03M 13/2906; H03M 13/6362; H03M 13/6306
See application file for complete search history.

(56) References Cited

U.S. PATENT DOCUMENTS

| | | | |
|---|---|---|---|
| 2007/0089025 A1 | 4/2007 | Hong et al. | |
| 2008/0130608 A1 | 6/2008 | Hwang et al. | |
| 2008/0276153 A1* | 11/2008 | Shen | H03M 13/2957 714/790 |
| 2009/0049360 A1* | 2/2009 | Shen | H04L 1/005 714/752 |
| 2010/0125764 A1* | 5/2010 | Kose | H03M 13/1171 714/704 |
| 2012/0051452 A1* | 3/2012 | Djordjevic | H04L 1/0057 375/295 |
| 2013/0121271 A1* | 5/2013 | Chen | H04W 72/02 370/329 |
| 2015/0194987 A1* | 7/2015 | Li | H04L 1/0057 714/752 |

FOREIGN PATENT DOCUMENTS

| | | |
|---|---|---|
| EP | 1699139 A2 | 9/2006 |
| RU | 2233540 C2 | 7/2004 |
| WO | 2004/040772 A1 | 5/2004 |

OTHER PUBLICATIONS

V. Bioglio, F. Gabry and I. Land, "Low-Complexity Puncturing and Shortening of Polar Codes," 2017 IEEE Wireless Communications and Networking Conference Workshops (WCNCW), San Francisco, CA, 2017, pp. 1-6.*

Kai Niu et al., "Beyond Turbo Codes: Rate-Compatible Punctured Polar Codes", IEEE 2013, p. 3423-3427.

Ido Tal et al., "List Decoding of Polar Codes", 2011 IEEE International Symposium on Information Theory, Jul. 31-Aug. 5, 2011, 14 pages.

Erdal Arikan, "Channel Polarization: A Method for Constructing Capacity-Achieving Codes for Symmetric Binary-Input Memoryless Channels", IEEE Transactions on Information Theory, vol. 55, No. 7, Jul. 2009, p. 3051-3073.

Viveck R. Cadambe et al., "Interference Alignment and Spatial Degrees of Freedom for the K User Interference Channel", IEEE, 2008, p. 971-975.

* cited by examiner

POLAR CODE PROCESSING METHOD AND SYSTEM, AND WIRELESS COMMUNICATIONS APPARATUS

CROSS-REFERENCE TO RELATED APPLICATIONS

This application is a continuation of International Application No. PCT/CN2013/090997, filed on Dec. 31, 2013, which is hereby incorporated by reference in its entirety.

TECHNICAL FIELD

The present invention relates to the field of communications technologies, and in particular, to a polar code processing method and system, and a wireless communications apparatus.

BACKGROUND

A communications system usually uses channel coding to improve reliability of data transmission and ensure quality of communication. polar code is a new channel coding method proposed by Erdal Arikan in 2007 based on a theory of channel polarization. The polar code is a coding-decoding algorithm that has relatively low complexity and that first theoretically proves that a Shannon capacity can be achieved.

In radio data transmission, rate matching often needs to be performed after data is coded, that is, a coded bit is punctured or repeated to match a bearer capability of a physical channel. If a quantity of input bits is less than a quantity of output bits, Puncturing is used. If the quantity of input bits is greater than the quantity of output bits, repetition is used. Puncturing means that some bits are deleted according to a specific pattern, and removed from a bit sequence. Repetition means that a current bit is inserted once between the current bit and a next bit. On the contrary to the rate matching algorithm, a rate de-matching algorithm restores a deleted bit or deletes a repeated bit. For a Hybrid Automatic Repeat Request (HARQ), the rate matching is used to determine a bit transmitted in each HARQ retransmission.

In the prior art, in the rate matching, when puncturing is required, a traditional random (quasi-random) puncturing technology may be used for the polar code, that is, a puncturing location is randomly selected. A Frame Error Rate (FER) of this puncturing manner in the prior art is relatively high, and HARQ performance is relatively poor.

SUMMARY

Embodiments of the present invention provide a polar code processing method and system, and a wireless communications apparatus, which are configured to reduce a frame error rate of an HARQ and enhance HARQ performance.

A first aspect of the present invention provides a polar code processing method, where the method includes:
acquiring at least two periodic puncturing patterns and combining the at least two periodic puncturing patterns in a predetermined manner to obtain at least two hybrid puncturing patterns;
selecting, from the at least two hybrid puncturing patterns, one with a lowest frame error rate as an optimal puncturing pattern; and performing rate matching on polar polar-coded bits according to the optimal puncturing pattern, and using the rate-matched bits as to-be-transmitted bits.

In a first possible implementation manner, the selecting, from the at least two hybrid puncturing patterns, one with a lowest frame error rate as an optimal puncturing pattern includes:
acquiring emulation results of the at least two hybrid puncturing patterns, comparing frame error rates of the emulation results of all hybrid puncturing patterns, and selecting a hybrid puncturing pattern with a lowest frame error rate as the optimal puncturing pattern.

In a second possible implementation manner, if the polar code is a systematic code, before the performing rate matching on polar-coded bits according to the optimal puncturing pattern, the method further includes:
separating a system bit and a check bit that are in the polar-coded bits into two groups: a system bit group and a check bit group; where
the performing rate matching on polar-coded bits according to the optimal puncturing pattern, and using the rate-matched bits as to-be-transmitted bits includes:
puncturing the system bit group according to the optimal puncturing pattern to obtain a first bit group;
puncturing the check bit group according to the optimal puncturing pattern to obtain a second bit group; and
combining the first bit group and the second bit group to obtain a third bit group as the to-be-transmitted bits.

In a third possible implementation manner, if the polar code is a non-systematic code, the performing rate matching on polar-coded bits according to the optimal puncturing pattern includes:
puncturing the entire polar-coded bits according to the optimal puncturing pattern; where
after the puncturing the entire polar-coded bits according to the optimal puncturing pattern, the method further includes:
interleaving the punctured bits; and
the using the rate-matched bits as to-be-transmitted bits includes:
using the interleaved bits as the to-be-transmitted bits.

According to the second or the third possible implementation manner of the first aspect of the present invention, in a fourth possible implementation manner, the method further includes:
sending the to-be-transmitted bits into a circular buffer; and
determining, according to a redundancy version parameter, a starting position of a bit that is in the circular buffer and that needs to be transmitted in each retransmission, and performing retransmission.

According to the second or the third possible implementation manner of the first aspect of the present invention, in a fifth possible implementation manner, the method further includes:
performing sequential interception or repetition on the to-be-transmitted bits to obtain the bit that needs to be transmitted in each retransmission, and performing retransmission.

In a sixth possible implementation manner, the periodic puncturing patterns are nested periodic puncturing patterns.

A second aspect of the present invention provides a polar code processing system, where the system includes:
a puncturing pattern acquiring unit, configured to acquire at least two periodic puncturing patterns and combine the at least two periodic puncturing patterns in a predetermined manner to obtain at least two hybrid puncturing patterns;

a puncturing pattern selection unit, configured to select, from the at least two hybrid puncturing patterns, one with a lowest frame error rate as an optimal puncturing pattern; and a rate matching unit, configured to perform rate matching on polar polar-coded bits according to the optimal puncturing pattern, and use the rate-matched bits as to-be-transmitted bits.

In a first possible implementation manner, the puncturing pattern selection unit is specifically configured to: acquire emulation results of the at least two hybrid puncturing patterns, compare frame error rates of the emulation results of all hybrid puncturing patterns, and select a hybrid puncturing pattern with a lowest frame error rate as the optimal puncturing pattern.

In a second possible implementation manner, if the polar code is a systematic code, the system further includes:

a grouping unit, configured to separate a system bit and a check bit that are in the polar-coded bits into two groups: a system bit group and a check bit group; where the rate matching unit specifically includes:

a first puncturing subunit, configured to puncture the system bit group according to the optimal puncturing pattern to obtain a first bit group;

a second puncturing subunit, configured to puncture the check bit group according to the optimal puncturing pattern to obtain a second bit group; and a combination subunit, configured to combine the first bit group and the second bit group to obtain a third bit group as the to-be-transmitted bits.

In a third possible implementation manner, if the polar code is a non-systematic code, the rate matching unit specifically includes:

a third puncturing subunit, configured to puncture the entire polar-coded bits according to the optimal puncturing pattern; where the system further includes:

an interleaving unit, configured to interleave bits outputted by the third puncturing subunit, and use bits outputted by the interleaving unit as the to-be-transmitted bits.

According to the second or the third possible implementation manner of the second aspect, in a fourth possible implementation manner, the system further includes:

a sending unit, configured to send the to-be-transmitted bits into a circular buffer; and a first retransmission unit, configured to determine, according to a redundancy version parameter, a starting position of a bit that is in the circular buffer and that needs to be transmitted in each retransmission, and perform retransmission.

According to the second or the third possible implementation manner of the second aspect, in a fifth possible implementation manner, the system further includes:

a second retransmission unit, configured to perform sequential interception or repetition on the to-be-transmitted bits to obtain the bit that needs to be transmitted in each retransmission, and perform retransmission.

In a sixth possible implementation manner, the periodic puncturing patterns are nested periodic puncturing patterns.

A third aspect of the present invention provides a wireless communications apparatus, including a memory, where the memory is configured to store an instruction for executing the following operations:

acquiring at least two periodic puncturing patterns and combining the at least two periodic puncturing patterns in a predetermined manner to obtain at least two hybrid puncturing patterns; selecting, from the at least two hybrid puncturing patterns, one with a lowest frame error rate as an optimal puncturing pattern; and performing rate matching on polar polar-coded bits according to the optimal puncturing pattern, and using the rate-matched bits as to-be-transmitted bits; and a processor, which is coupled with the memory and is configured to execute the instruction stored in the memory.

In a first possible implementation manner, the memory is specifically configured to store an instruction for executing the following operations:

acquiring emulation results of the at least two hybrid puncturing patterns, comparing frame error rates of the emulation results of all hybrid puncturing patterns, and selecting a hybrid puncturing pattern with a lowest frame error rate as the optimal puncturing pattern.

In a second possible implementation manner, if the polar code is a systematic code, the memory is further configured to store an instruction for executing the following operations:

separating a system bit and a check bit that are in the polar-coded bits into two groups: a system bit group and a check bit group; where the memory is specifically configured to store an instruction for executing the following operations:

puncturing the system bit group according to the optimal puncturing pattern to obtain a first bit group;

puncturing the check bit group according to the optimal puncturing pattern to obtain a second bit group; and combining the first bit group and the second bit group to obtain a third bit group as the to-be-transmitted bits.

In a third possible implementation manner, if the polar code is a non-systematic code, the memory is specifically configured to store an instruction for executing the following operations:

puncturing the entire polar-coded bits according to the optimal puncturing pattern;

interleaving the punctured bits; and using the interleaved bits as the to-be-transmitted bits.

According to the second or the third possible implementation manner of the third aspect, in a fourth possible implementation manner, the memory is further configured to store an instruction for executing the following operations:

sending the to-be-transmitted bits into a circular buffer; and determining, according to a redundancy version parameter, a starting position of a bit that is in the circular buffer and that needs to be transmitted in each retransmission, and performing retransmission.

According to the second or the third possible implementation manner of the third aspect, in a fifth possible implementation manner, the memory is further configured to store an instruction for executing the following operations:

performing sequential interception or repetition on the to-be-transmitted bits to obtain the bit that needs to be transmitted in each retransmission, and performing retransmission.

In a sixth possible implementation manner, the periodic puncturing patterns are nested periodic puncturing patterns.

Compared with the prior art, in the foregoing technical solutions, at least two periodic puncturing patterns are combined to obtain at least two hybrid puncturing patterns, and a hybrid puncturing pattern with a lowest frame error rate is selected from the at least two hybrid puncturing patterns as an optimal puncturing pattern that is finally adopted, which may reduce a frame error rate and enhance HARQ performance in comparison with a random puncturing solution in the prior art.

BRIEF DESCRIPTION OF THE DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and a person of ordinary skill in the art may still derive other drawings from these accompanying drawings without creative efforts.

DETAILED DESCRIPTION

The following clearly describes the technical solutions in the embodiments of the present invention with reference to the accompanying drawings in the embodiments of the present invention Apparently, the described embodiments are merely some but not all of the embodiments of the present invention. All other embodiments obtained by a person of ordinary skill in the art based on the embodiments of the present invention without creative efforts shall fall within the protection scope of the present invention.

Embodiment 1

Figure 1:
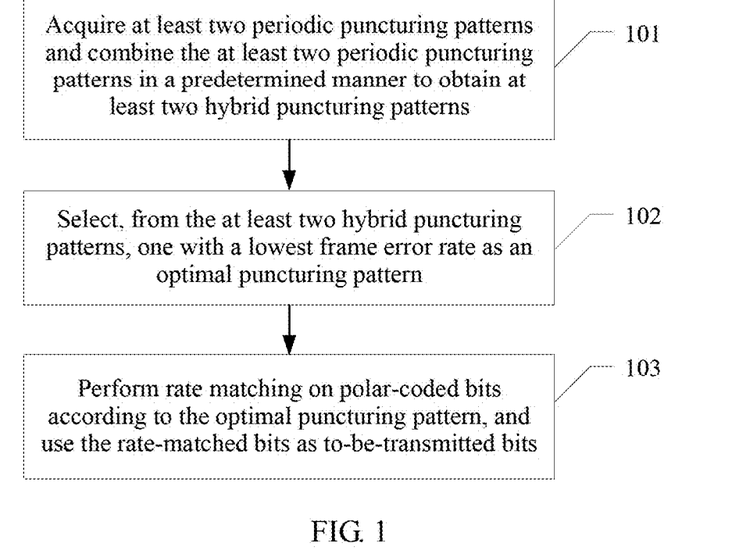
FIG. 1 is a schematic flowchart of a polar code processing method according to Embodiment 1 of the present invention.

Referring to FIG. 1, FIG. 1 is a schematic flowchart of a polar code processing method according to Embodiment 1 of the present invention. As shown in FIG. 1, the method may include:

101. Acquire at least two periodic puncturing patterns and combine the at least two periodic puncturing patterns in a predetermined manner to obtain at least two hybrid puncturing patterns.

The periodic puncturing patterns described in this embodiment refer to periodically repeated and fixed puncturing patterns. For example, if a periodic puncturing pattern is (1100111), where a period T is 7, 0 indicates deletion, and 1 indicates reservation, the periodic puncturing pattern indicates performing puncturing according to (110011111001111100111 . . . ).

In this embodiment, the at least two periodic puncturing patterns may be entered by a user or read from pre-stored data. Defining two periodic puncturing patterns is used as an example, where the two periodic puncturing patterns are respectively patterns P1 and P2, a period of the periodic puncturing pattern P1 is T1, and a period of the periodic puncturing pattern P2 is T2.

For example, the foregoing predetermining manner may include sequential arrangement or alternate arrangement. If the patterns P1 and P2 are sequentially arranged, obtained hybrid puncturing patterns may be P1, P1, P1, . . . , P1, P2, P2, P2, . . . , P2; or if the patterns P1 and P2 are alternately arranged, obtained hybrid puncturing patterns are P1, P2, P1, P2, P1, P2, . . . , P1, P2.

Certainly, the foregoing predetermining manner of combining periodic puncturing patterns is not limited to the foregoing two types, and a person skilled in the art may use, according to an actual situation, another manner to combine the at least two periodic puncturing patterns, and no specific limitation is imposed herein.

102. Select, from the at least two hybrid puncturing patterns, one with a lowest frame error rate as an optimal puncturing pattern.

103. Perform rate matching on polar-coded bits according to the optimal puncturing pattern, and use the rate-matched bits as to-be-transmitted bits.

In the polar code processing method provided in this embodiment of the present invention, at least two periodic puncturing patterns are combined to obtain at least two hybrid puncturing patterns, and a hybrid puncturing pattern with a lowest frame error rate is selected from the at least two hybrid puncturing patterns as an optimal puncturing pattern that is finally adopted, which may reduce a frame error rate and enhance HARQ performance of a polar code in comparison with a random puncturing solution in the prior art.

Embodiment 2

Figure 2:
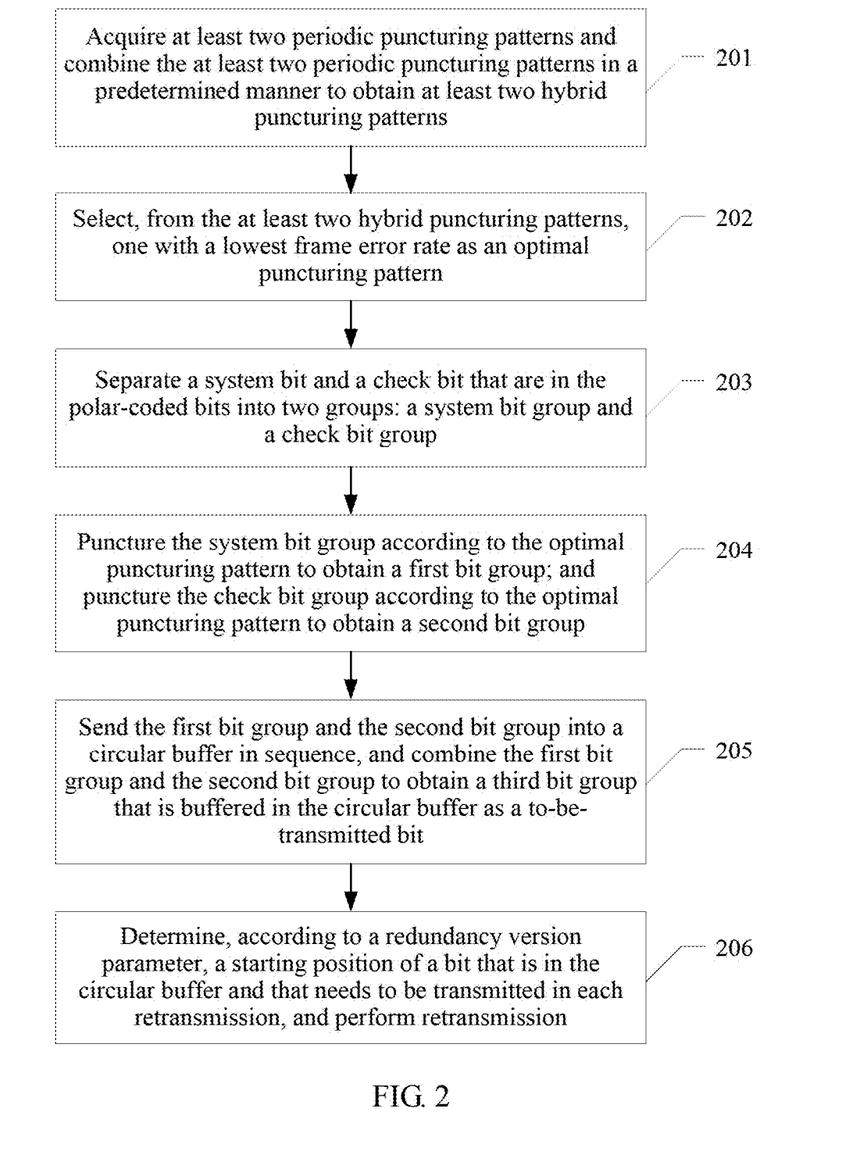
FIG. 2 is a schematic flowchart of a polar code processing method according to Embodiment 2 of the present invention.

Referring to FIG. 2, FIG. 2 is a schematic flowchart of a polar code processing method according to Embodiment 2 of the present invention. In the embodiment shown in FIG. 2, the polar code is a systematic code. As shown in FIG. 2, the method may include:

201. Acquire at least two periodic puncturing patterns and combine the at least two periodic puncturing patterns in a predetermined manner to obtain at least two hybrid puncturing patterns.

In this embodiment, the at least two periodic puncturing patterns may be entered by a user or read from pre-stored data. Defining two periodic puncturing patterns is used as an example, where the two periodic puncturing patterns are respectively patterns P1 and P2, a period of the periodic puncturing pattern P1 is T1, and a period of the periodic puncturing pattern P2 is T2. For example, the foregoing predetermining manner may include sequential arrangement or alternate arrangement. If the patterns P1 and P2 are sequentially arranged, obtained hybrid puncturing patterns may be P1, P1, P1, . . . , P1, P2, P2, P2, . . . , P2; or if the patterns P1 and P2 are alternately arranged, obtained hybrid puncturing patterns are P1, P2, P1, P2, P1, P2, . . . , P1, P2.

Preferably, the foregoing periodic puncturing patterns may be nested periodic puncturing patterns. In this embodiment, "nested" puncturing patterns indicates that a puncturing location (a location of 0), which is of a puncturing pattern corresponding to a polar code that is corresponding to a relatively high bit rate and is transmitted in previous retransmission, must include a puncturing location of a puncturing pattern corresponding to a polar code that is corresponding to a relatively low bit rate and is transmitted in subsequent retransmission.

202. Select, from the at least two hybrid puncturing patterns, one with a lowest frame error rate as an optimal puncturing pattern.

For example, a method for selecting the optimal puncturing pattern may be: acquiring emulation results of the at least two hybrid puncturing patterns, comparing frame error rates of the emulation results of all hybrid puncturing patterns, and selecting a hybrid puncturing pattern with a lowest frame error rate as the optimal Puncturing pattern.

203. Separate a system bit and a check bit that are in the polar-coded bits into two groups: a system bit group and a check bit group.

In the systematic code, a system bit and a check bit are separate. For the systematic code, the system bit and the check bit may be separated into two groups. Separating the systematic code into two groups for rate matching may reduce a bit error rate of an HARQ.

204. Puncture the system bit group according to the optimal puncturing pattern to obtain a first bit group; and puncture the check bit group according to the optimal puncturing pattern to obtain a second bit group.

205. Send the first bit group and the second bit group into a circular buffer in sequence, and combine the first bit group and the second bit group to obtain a third bit group that is buffered in the circular buffer as a to-be-transmitted bit.

206. Determine, according to a redundancy version parameter, a starting position of a bit that is in the circular buffer and that needs to be transmitted in each retransmission, and perform retransmission.

Embodiment 3

Figure 3:
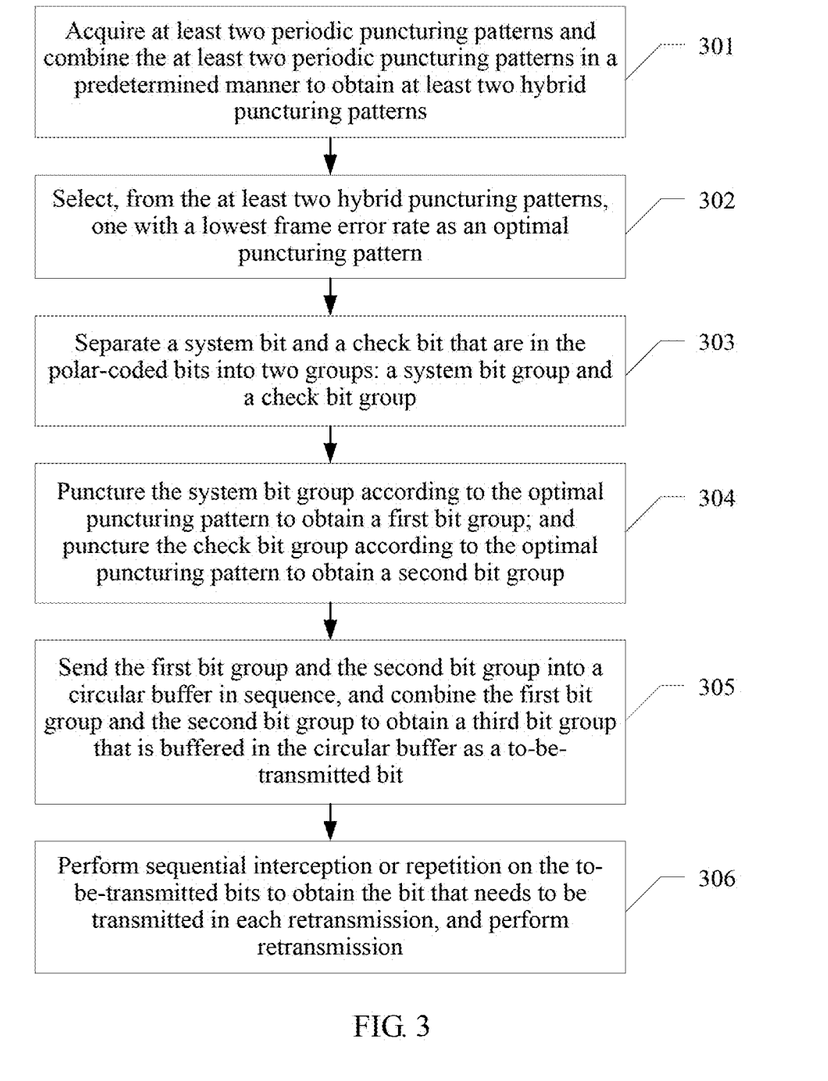
FIG. 3 is a schematic flowchart of a polar code processing method according to Embodiment 3 of the present invention.

Referring to FIG. 3, FIG. 3 is a schematic flowchart of a polar code processing method according to Embodiment 3 of the present invention. In the embodiment shown in FIG. 3, the polar code is a systematic code. As shown in FIG. 3, the method may include:

301. Acquire at least two periodic puncturing patterns and combine the at least two periodic puncturing patterns in a predetermined manner to obtain at least two hybrid puncturing patterns.

302. Select, from the at least two hybrid puncturing patterns, one with a lowest frame error rate as an optimal puncturing pattern.

303. Separate a system bit and a check bit that are in the polar-coded bits into two groups: a system bit group and a check bit group.

In the systematic code, a system bit and a check bit are separate. For the systematic code, the system bit and the check bit may be separated into two groups. Separating the systematic code into two groups for rate matching may reduce a bit error rate of an HARQ.

304. Puncture the system bit group according to the optimal puncturing pattern to obtain a first bit group; and puncture the check bit group according to the optimal puncturing pattern to obtain a second bit group.

305. Combine the first bit group and the second bit group to obtain a third bit group as to-be-transmitted bits.

306. Perform sequential interception or repetition on the to-be-transmitted bits to obtain the bit that needs to be transmitted in each retransmission, and perform retransmission.

Embodiment 4

Figure 4:
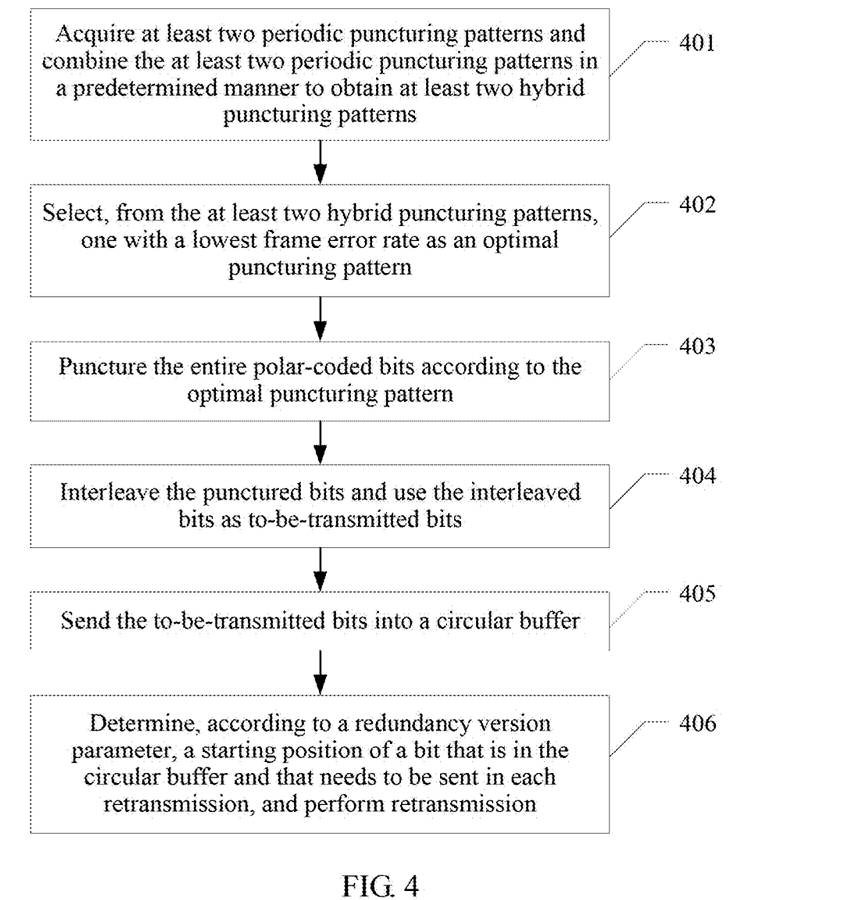
FIG. 4 is a schematic flowchart of a polar code processing method according to Embodiment 4 of the present invention.

Referring to FIG. 4, FIG. 4 is a schematic flowchart of a polar code processing method according to Embodiment 4 of the present invention. In the embodiment shown in FIG. 4, the polar code is a non-systematic code. As shown in FIG. 4, the method may include:

401. Acquire at least two periodic puncturing patterns and combine the at least two periodic puncturing patterns in a predetermined manner to obtain at least two hybrid puncturing patterns.

Preferably, the foregoing periodic puncturing patterns may be nested (nestle) periodic puncturing patterns.

402. Select, from the at least two hybrid puncturing patterns, one with a lowest frame error rate as an optimal puncturing pattern.

403. Puncture the entire polar-coded bits according to the optimal puncturing pattern.

404. Interleave the punctured bits and use the interleaved bits as to-be-transmitted bits.

405. Send the to-be-transmitted bits into a circular buffer.

406. Determine, according to a redundancy version parameter, a starting position of a bit that is in the circular buffer and that needs to be sent in each retransmission, and perform retransmission.

Embodiment 5

Figure 5:
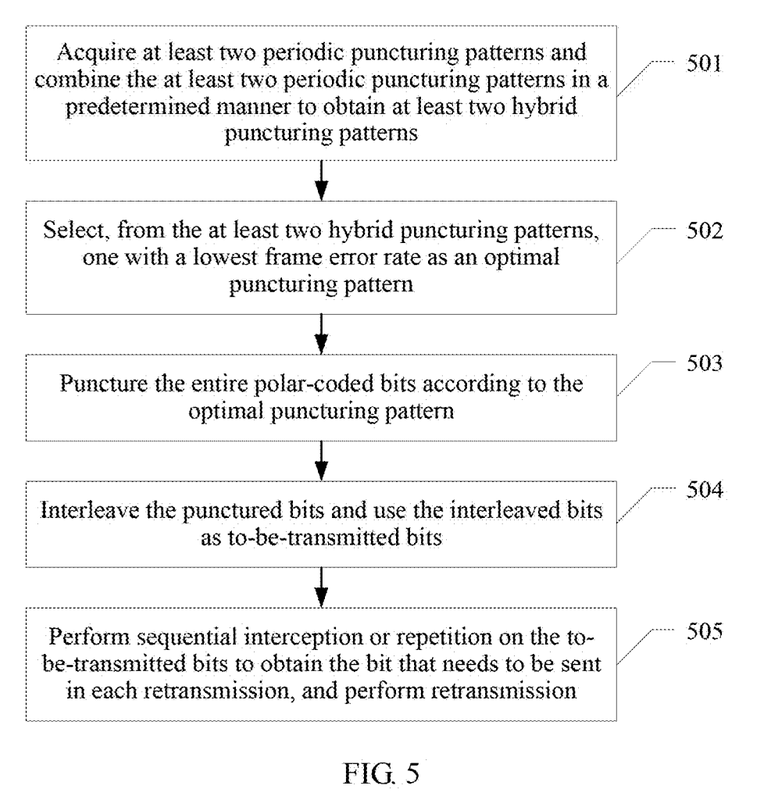
FIG. 5 is a schematic flowchart of a polar code processing method according to Embodiment 5 of the present invention.

Referring to FIG. 5, FIG. 5 is a schematic flowchart of a polar code processing method according to Embodiment 5 of the present invention. In the embodiment shown in FIG. 5, the polar code is a non-systematic code. As shown in FIG. 5, the method may include:

501. Acquire at least two periodic puncturing patterns and combine the at least two periodic puncturing patterns in a predetermined manner to obtain at least two hybrid puncturing patterns.

Preferably, the foregoing periodic puncturing patterns may be nested (nestle) periodic puncturing patterns.

502. Select, from the at least two hybrid puncturing patterns, one with a lowest frame error rate as an optimal puncturing pattern.

503. Puncture the entire polar-coded bits according to the optimal puncturing pattern.

504. Interleave the punctured bits and use the interleaved bits as to-be-transmitted bits.

505. Perform sequential interception or repetition on the to-be-transmitted bits to obtain the bit that needs to be sent in each retransmission, and perform retransmission.

Embodiment 6

Figure 6:
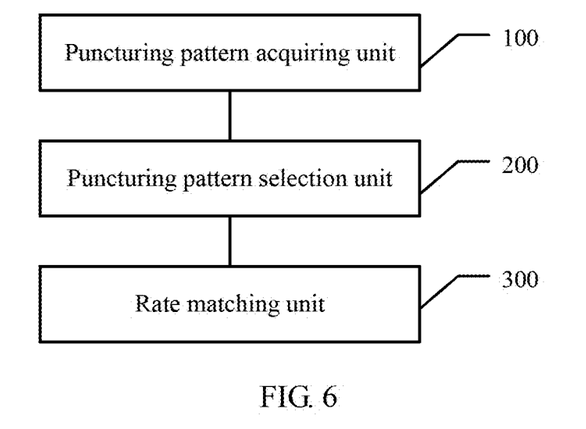
FIG. 6 is a first schematic structural diagram of a polar code processing system according to Embodiment 6 of the present invention.

Referring to FIG. 6, FIG. 6 is a schematic structural diagram of a polar code processing system according to Embodiment 6 of the present invention. As shown in FIG. 6, the system may include:

a puncturing pattern acquiring unit 100, configured to acquire at least two periodic puncturing patterns and combine the at least two periodic puncturing patterns in a predetermined manner to obtain at least two hybrid puncturing patterns;

preferably, the foregoing periodic puncturing patterns may be nested (nestle) periodic puncturing patterns;

a puncturing pattern selection unit 200, configured to select, from the at least two hybrid puncturing patterns, one with a lowest frame error rate as an optimal puncturing pattern; and a rate matching unit 300, configured to perform rate matching on polar polar-coded bits according to the optimal puncturing pattern, and use the rate-matched bits as to-be-transmitted bits.

Figure 7:
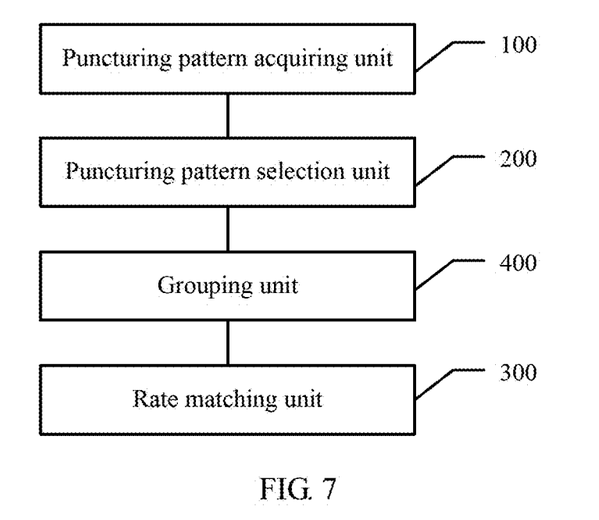
FIG. 7 is a second schematic structural diagram of a polar code processing system according to Embodiment 6 of the present invention.

Preferably, if the polar code is a systematic code, as shown in FIG. 7, the system may further include:

a grouping unit 400, configured to separate a system bit and a check bit that are in the polar-coded bits into two groups: a system bit group and a check bit group.

Correspondingly, the rate matching unit 300 may specifically include:

a first puncturing subunit (not shown in the figure), configured to puncture the system bit group according to the optimal puncturing pattern to obtain a first bit group;

a second puncturing subunit (not shown in the figure), configured to puncture the check bit group according to the optimal puncturing pattern to obtain a second bit group; and a combination subunit, configured to combine the first bit group and the second bit group to obtain a third bit group as the to-be-transmitted bits.

Preferably, if the polar code is a non-systematic code, the rate matching unit 300 may include:

a third puncturing subunit (not shown in the figure), configured to puncture the entire polar-coded bits according to the optimal puncturing pattern.

Figure 8:
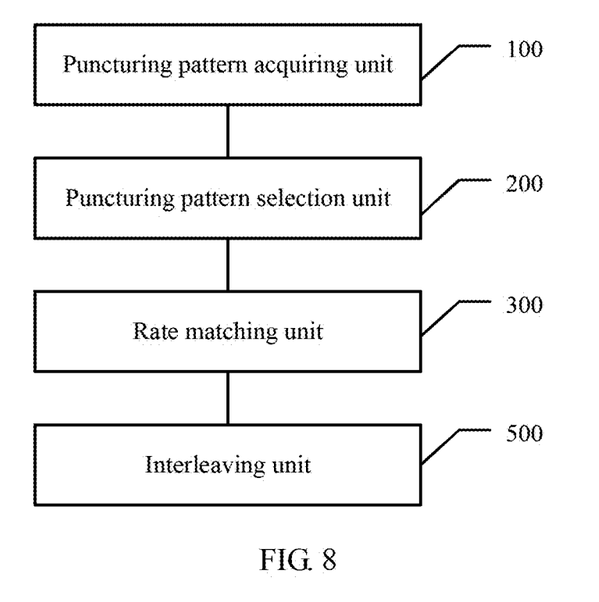
FIG. 8 is a third schematic structural diagram of a polar code processing system according to Embodiment 6 of the present invention.

Correspondingly, as shown in FIG. 8, the system may further include:

an interleaving unit 500, configured to interleave bits outputted by the third puncturing subunit, and use bits outputted by the interleaving unit 500 as the to-be-transmitted bits.

After obtaining the to-be-transmitted bits, the system may perform retransmission on the to-be-transmitted bits.

In some implementation manners of the present invention, the system may further include:

a sending unit (not shown in the figure), configured to send the to-be-transmitted bits into a circular buffer; and a first retransmission unit (not shown in the figure), configured to determine, according to a redundancy version parameter, a starting position of a bit that is in the circular buffer and that needs to be sent in each retransmission, and perform retransmission.

In some other implementation manners of the present invention, the system may further include:

a second retransmission unit (not shown in the figure), configured to perform sequential interception or repetition on the to-be-transmitted bits to obtain the bit that needs to be sent in each retransmission, and perform retransmission.

Embodiment 7

Figure 9:
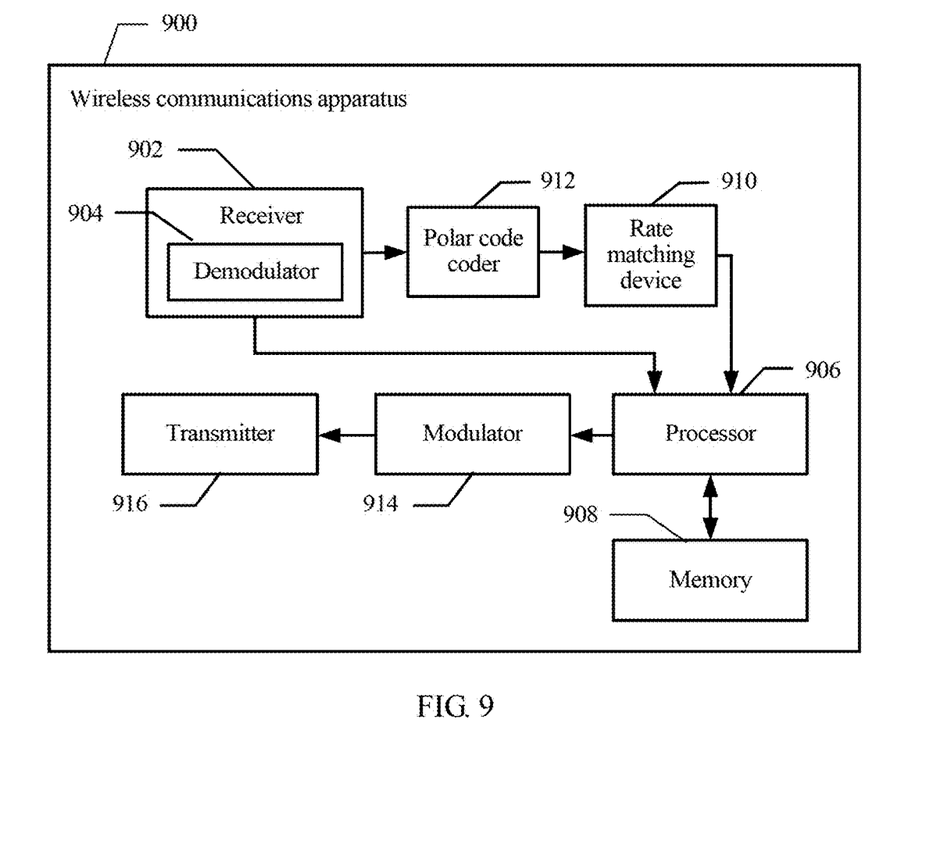
FIG. 9 is a schematic structural diagram of a wireless communications apparatus according to Embodiment 7 of the present invention.

Referring to FIG. 9, FIG. 9 is a schematic structural diagram of a wireless communications apparatus according to Embodiment 7 of the present invention. As shown in FIG. 9, the wireless communications apparatus 900 may include a receiver 902, where the receiver 902 may be configured to: receive a signal from, for example, a receive antenna (not shown), perform a typical action (such as filtering, amplifying, and down-converting) on the received signal, and perform digitalization on an adjusted signal to obtain a sample. The receiver 902 may be, for example, a Minimum Mean-Squared Error (MMSE) receiver. The wireless communications apparatus 900 may further include a demodulator 904. The demodulator 904 may be configured to demodulate a received symbol and provide the symbol to a processor 906 for channel estimation. The processor 906 may be: a processor that is specially configured to analyze information received by the receiver 902 and/or generate information that is to be sent by a transmitter 916; a processor configured to control one or more components of the wireless communications apparatus 900; and/or a controller that is configured to: analyze information received by the receiver 902, generate information that is to be sent by a transmitter 916, and control one or more components of the wireless communications apparatus 900.

The wireless communications apparatus 900 may be an access terminal or a base station, or another possible apparatus.

The wireless communications apparatus 900 may additionally include a memory 908. The memory 908 may be operationally coupled to the processor 906 and store the following data: data to be sent, data received, and any other proper information related to execution of various actions and functions described in this specification. The memory 908 may additionally store a protocol and/or an algorithm that are/is related to polar code processing.

The memory 908 may be configured to store an instruction for executing the following operations:

acquiring at least two periodic puncturing patterns and combining the at least two periodic puncturing patterns in a predetermined manner to obtain at least two hybrid puncturing patterns; selecting, from the at least two hybrid puncturing patterns, one with a lowest frame error rate as an optimal puncturing pattern; and performing rate matching on polar polar-coded bits according to the optimal puncturing pattern, and using the rate-matched bits as to-be-transmitted bits.

The processor 906, coupled with the memory 908, may be configured to execute the instruction stored in the memory 908.

It can be understand that a data storage apparatus (such as the memory 908) described in this specification may be a volatile memory or a non-volatile memory, or may include both of a volatile memory and a non-volatile memory. For example, which imposes no limitation, the non-volatile memory may include: a ROM (Read-Only Memory, read-only memory), a PROM (Programmable ROM, programmable read-only memory), an EPROM (Erasable PROM, erasable programmable read-only memory), an EEPROM (Electrically EPROM, electrically erasable programmable read-only memory), or a flash memory. The volatile memory may include: a RAM (Random Access Memory, random access memory), which is used as an external cache. According to description that can be used as an example but imposes no limitation, RAMs of many forms are applicable, such as an SRAM (Static RAM, static random access memory), a DRAM (Dynamic RAM, dynamic random access memory), an SDRAM (Synchronous DRAM, synchronous dynamic random access memory), a DDR SDRAM (Double Data Rate SDRAM, double data rate synchronous dynamic random access memory), an ESDRAM (Enhanced SDRAM, enhanced synchronous dynamic random access memory), an SLDRAM (Synchlink DRAM, synchlink dynamic random access memory), and a DR RAM (Direct Rambus RAM, direct rambus random access memory). The memory 908 in both a device and a method described in this specification aims to include but is not limited to these and a memory of another proper type.

In an actual application, the receiver 902 may further be coupled to the rate matching device 910. In addition, the wireless communications apparatus 900 may include: a polar code coder 912. The rate matching device 910 may be configured to perform, by using the optimal puncturing pattern, rate matching on a polar-coded bit outputted by the polar code coder 912, and use rate-matched bits as to-be-transmitted bits and output the to-be-transmitted bits.

Optionally, the memory 908 is specifically configured to store an instruction for executing the following operations:

acquiring emulation results of the at least two hybrid puncturing patterns, comparing frame error rates of the emulation results of all hybrid puncturing patterns, and selecting a hybrid puncturing pattern with a lowest frame error rate as the optimal puncturing pattern.

Preferably, in one implementation manner, if the foregoing polar code is a systematic code, the memory 908 is further configured to store an instruction for executing the following operations:

separating a system bit and a check bit that are in the polar-coded bits into two groups: a system bit group and a check bit group.

Specifically, the memory 908 is specifically configured to store an instruction for executing the following operations:

puncturing the system bit group according to the optimal puncturing pattern to obtain a first bit group;

puncturing the check bit group according to the optimal puncturing pattern to obtain a second bit group; and combining the first bit group and the second bit group to obtain a third bit group as the to-be-transmitted bits.

Preferably, in another implementation manner, if the foregoing polar code is a non-systematic code, the memory 908 is specifically configured to store an instruction for executing the following operations:

puncturing the entire polar-coded bits according to the optimal puncturing pattern;

interleaving the punctured bits; and using the interleaved bits as the to-be-transmitted bits.

Specifically, if the foregoing polar code is a non-systematic code, the memory 908 is specifically configured to store an instruction for executing the following operations:

puncturing the entire polar-coded bits according to the optimal puncturing pattern;

interleaving the punctured bits; and using the interleaved bits as the to-be-transmitted bits.

Optionally, in one implementation manner, the memory 908 is further configured to store an instruction for executing the following operations:

sending the to-be-transmitted bits into a circular buffer; and determining, according to a redundancy version parameter, a starting position of a bit that is in the circular buffer and that needs to be transmitted in each retransmission, and performing retransmission.

The wireless communications apparatus 900 may further include a circular buffer (not shown in the figure). The circular buffer may configured to buffer the to-be-transmitted bits, and the circular buffer may be a part of the memory 908.

Optionally, in one implementation manner, the memory 908 is further configured to store an instruction for executing the following operations:

performing sequential interception or repetition on the to-be-transmitted bits to obtain the bit that needs to be transmitted in each retransmission, and performing retransmission.

In addition, the wireless communications apparatus 900 may further include a transmitter 916 and a modulator 914. In an actual application, the modulator 914 may perform signal modulation on the to-be-transmitted bits, and the transmitter 916 may transmit the to-be-transmitted bits after the signal modulation. Although it is illustrated that the polar code coder 912, the rate matching device 910 and/or the modulator 914 are independent of the processor 906, it should be understood that the polar code coder 912, the rate matching device 910 and/or the modulator 914 may be a part of the processor 906 or multiple processors (not shown).

It may be understood that the embodiments described in this specification may be implemented by hardware, software, firmware, middleware, microcode or a combination thereof. For hardware implementation, a processing unit may be implemented in one or more ASICs (Application Specific integrated Circuits,), DSPs (Digital Signal Processer), DSPDs (DSP Device, digital signal processing device), PLDs (Programmable Logic Device), FPGAs (Field-Programmable Gate Array,), processors, controllers, microcontrollers, microprocessors, other electronic units for performing the functions in this application, or a combination thereof.

When the embodiments are implemented in software, firmware, middleware, microcode, program code, or a code segment, they may be stored in a machine-readable medium of, for example, a storage component. The code segment may represent a process, a function, a subprogram, a program, a routine, a subroutine, a module, a software group, a class, or any combination of instructions, data structures or program statements. The code segment may be coupled to another code segment or hardware circuit by transmitting and/or receiving information, data, an independent variable, a parameter, or memory content. The information, the independent variable, the parameter, the data, and the like may be transferred, forwarded, or sent in any suitable manner including memory sharing, message transfer, token transfer, network transmission, and the like.

For software implementation, the technology described in this specification may be implemented by using modules for executing the functions (for example, a process or a function) described in this specification. Software code may be stored in a memory unit and executed by a processor. The memory unit may be implemented inside a processor or outside a processor, and in the latter case, the memory unit may be coupled to the processor in a communication manner through various means known in the art.

Examples of one or more embodiments are described above. Certainly, it is impossible to describe all possible combinations of components or methods to describe the embodiments, but a person of ordinary skill in the art should know that the embodiments may further combined and modified. Therefore, the embodiments described in this application are intended to include all changes, modifications, and variations falling within the spirit and the protection scope of the appended claims. In addition, for a term "include" used in this specification, a coverage manner of the term is similar to that of a term "comprise", as explained by the term "comprise" used as a transitional word in the claims.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a specific working process of the system, apparatus, and unit described above, reference may be made to a corresponding process in the foregoing method embodiments, and details are not described herein again.

In the several embodiments provided in this application, it should be understood that the disclosed method, device, and apparatus may be implemented in other manners. For example, the described device embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the devices or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present invention essentially, or the part contributing to the prior art, or some of the technical solutions may be implemented in a form of a software product. The software product is stored in a storage medium, and includes several instructions for instructing a computer device (which may be a personal computer, a server, or a network device) to perform all or some of the steps of the methods described in the embodiments of the present invention. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

It should be noted that, all the foregoing embodiments are based on a same inventive concept, and for a part that is not described in detail in an individual embodiment, reference may be made to description in another embodiment.

The polar code processing method and device, and the wireless communications apparatus provided in the embodiments of the present invention are described above in detail. In this specification, specific examples are used to describe the principle and implementation manners of the present invention, and the description of the foregoing embodiments is intended only to help understand the method and core idea of the present invention. In addition, a person of ordinary skill in the art may, according to the idea of the present invention, make modifications with respect to the specific implementation manners and the application scope. In conclusion, the content of this specification shall not be construed as a limitation on the present invention.

What is claimed is:

1. A method for processing polar code, comprising:
    obtaining, by a wireless communication apparatus, a plurality of data bits;
    performing, by the wireless communication apparatus, polar encoding on the plurality of data bits, to obtain a plurality of polar-coded bits;
    performing, by the wireless communication apparatus, rate matching on the plurality of polar-coded bits according to an optimal puncturing pattern, wherein the optimal puncturing pattern is selected from at least two types of hybrid puncturing patterns, wherein the at least two types of hybrid puncturing patterns comprise:
        a puncturing pattern obtained by combining at least two periodic puncturing patterns in a sequential arrangement, or
        a puncturing pattern obtained by combining at least two periodic puncturing patterns in an alternate arrangement; and
    transmitting, by the wireless communication apparatus, a plurality of rate-matched bits.

2. The method according to claim 1, wherein:
    before performing rate matching on the plurality of polar-coded bits according to the optimal puncturing pattern, the method further comprises:
        separating, by the wireless communication apparatus, a system bit and a check bit that are in the polar-coded bits into two groups: a system bit group and a check bit group; and
    performing rate matching on the plurality of polar-coded bits according to the optimal puncturing pattern comprises:
        puncturing, by the wireless communication apparatus, the system bit group according to the optimal puncturing pattern to obtain a first bit group,
        puncturing, by the wireless communication apparatus, the check bit group according to the optimal puncturing pattern to obtain a second bit group, and
        combining, by the wireless communication apparatus, the first bit group and the second bit group to obtain a third bit group.

3. The method according to claim 2, further comprising:
    performing sequential interception or repetition on the plurality of rate-matched bits to obtain the bit that needs to be transmitted in each retransmission, and performing retransmission.

4. The method according to claim 1, wherein:
    before the step of performing rate matching on the plurality of polar-coded bits according to the optimal puncturing pattern, the method further comprises:
        interleaving the plurality of rate-matched bits.

5. The method according to claim 1, wherein the periodic puncturing patterns are nested periodic puncturing patterns.

6. A wireless communication apparatus, comprising:
    a memory configured to store instructions; and
    a processor coupled to the memory and configured to:
        obtain a plurality of data bits;
        perform polar encoding on the plurality of data bits, to obtain a plurality of polar-coded bits; and
        perform rate matching on the plurality of polar-coded bits according to an optimal puncturing pattern, wherein the optimal puncturing pattern is selected from at least two types of hybrid puncturing patterns, wherein the at least two types of hybrid puncturing patterns comprise: a puncturing pattern obtained by combining at least two periodic puncturing patterns in a sequential arrangement or a puncturing pattern obtained by combining at least two periodic puncturing patterns in an alternate arrangement.

7. The wireless communication apparatus according to claim 6, wherein the processor is further configured to:
    separate a system bit and a check bit that are in the polar-coded bits into two groups: a system bit group and a check bit group;
    puncture the system bit group according to the optimal puncturing pattern to obtain a first bit group;

puncture the check bit group according to the optimal puncturing pattern to obtain a second bit group; and combine the first bit group and the second bit group to obtain a third bit group.

8. The wireless communication apparatus according to claim 6, wherein the processor is further configured to:

interleave the plurality of rate-matched bits.

9. The wireless communication apparatus according to claim 6, wherein the processor is further configured to:

perform sequential interception or repetition on the plurality of rate-matched bits to obtain the bit that needs to be transmitted in each retransmission, and perform retransmission.

10. The wireless communication apparatus according to claim 6, wherein the periodic puncturing patterns are nested periodic puncturing patterns.

* * * * *